US006147875A

United States Patent [19]

Yoshigi

[11] Patent Number: 6,147,875

[45] Date of Patent: Nov. 14, 2000

[54] CIRCUIT BODY

[75] Inventor: Toshimasa Yoshigi, Shizuoka, Japan

[73] Assignee: Yazaki Corporation, Tokyo, Japan

[21] Appl. No.: 09/271,273

[22] Filed: Mar. 17, 1999

[30] Foreign Application Priority Data

Mar. 20, 1998 [JP] Japan .................................. 10-072583

[51] Int. Cl.[7] ........................................................ H05K 1/18

[52] U.S. Cl. .......................... 361/760; 361/765; 361/801; 439/247; 439/248

[58] Field of Search ..................................... 361/760, 765, 361/792, 801; 439/247, 248, 74, 682, 485

[56] References Cited

U.S. PATENT DOCUMENTS

| | | | |
|---|---|---|---|
| 4,410,230 | 10/1983 | SanMiguel | 439/682 |
| 5,286,222 | 2/1994 | Yagi et al. | 439/607 |
| 5,310,351 | 5/1994 | McAdow et al. | 439/74 |
| 5,622,511 | 4/1997 | Jarrett | 439/248 |
| 5,902,149 | 5/1999 | Tashiro et al. | 439/557 |
| 5,947,759 | 9/1999 | Kameyama et al. | 439/248 |
| 6,017,233 | 1/2000 | Fry et al. | 439/248 |

FOREIGN PATENT DOCUMENTS

| | | | |
|---|---|---|---|
| 61-126783 | 6/1986 | Japan | H01R 9/09 |

*Primary Examiner*—Jeffrey Gaffin
*Assistant Examiner*—David Foster
*Attorney, Agent, or Firm*—Sughrue, Mion, Zinn, Macpeak & Seas, PLLC

[57] ABSTRACT

A circuit body 10 includes a main circuit body 12 having an inner circuit; a plurality of connector blocks 13, 14 integrally supported by the main circuit body 12 and directly connected to electric parts; and flexible legs 21*a*, 21*b*, 21*c*, 21*d* for supporting the plurality of connector blocks 13, 14 independently from the main circuit body 12 so that they can be freely moved in the direction perpendicular to the connecting direction of the electric parts.

2 Claims, 5 Drawing Sheets

CIRCUIT BODY

BACKGROUND OF THE INVENTION

The present invention relates to a circuit body to which electric parts are directly connected.

Related Art

FIG. 2 is a view showing A/T unit 1. In a main body 2 of this unit 1, there are provided a plurality of electric parts (shown in FIG. 5) 3 such as a solenoid valve which is an electromagnetic valve for turning on and off a hydraulic circuit. Electric parts 3 are directly connected to a circuit body (shown in FIG. 4) 4 arranged in the primary body 5. The circuit body 4 includes: a primary body 5 of the circuit body having an inner circuit 30; a plurality of connector blocks 6 to which the electric parts 3 are directly connected; and a cover (shown in FIG. 3) 31 for closing a backside of the main body 5 of the circuit body.

As shown in FIGS. 3 and 4, the inner circuit 30 is composed of electric wires 32, 34 arranged in the primary body 5 of the circuit body, and terminals 33. Each terminal 33 is composed of a contact section 33*a* accommodated in a terminal accommodating chamber 35 of the connector block 6, and a crimp section 33*b* to which the electric wires 32, 34 are crimped. The terminal 33 is directly connected to a contact section 33*a* arranged in the connector block 6, and also connected to a terminal section 3*a* of the electric part 3.

As shown in FIG. 5(*a*), the circuit body 4 to which the electric parts 3 such as a solenoid valve are directly connected is fixed to the main body 2 of the unit 1 by screws 7. When the electric parts 3 are directly engaged with the connector block 6, they are connected to the inner circuit of the circuit body 4, so that they can be connected to an electric power source arranged outside via the wire harness 8 which is drown out from the inner circuit.

However, when errors are caused in the process of assembling the electric parts 3 to the main body 2 of the unit 1, the terminals 3*a* connected to the connector block 6 deviate from predetermined positions. Accordingly, there is caused a positional deviation between the terminals 3*a* connected to the connector block 6 and the terminals of a bus bar arranged in the connector block 6. Therefore, the contact sections 33*a* of the terminals 33 are pushed by the terminals 3*a* of the electric parts 3. As a result, the reliability of contact points is deteriorated.

SUMMAY OF THE INVENTION

It is an object of the present invention to provide a circuit body in which the positional deviation of electric parts is absorbed and the reliability of contact can be enhanced.

In order to accomplish the above object, the present invention provides a circuit body comprising: a main circuit body having an inner circuit; a plurality of connector blocks integrally supported by the main circuit body and directly connected to electric parts; and flexible legs for supporting the plurality of connector blocks independently from the main circuit body so that they can be freely moved in the direction perpendicular to the connecting direction of the electric parts.

When electric parts are directly connected to the connector block in this circuit body, the connector block can be freely moved in the direction perpendicular to the connecting direction. Therefore, it is possible to absorb the positional deviation of the electric parts. As a result, it is possible to connect the connector block to the electric parts in a good condition.

The present invention provides a circuit body, the inner circuit including: a plurality of terminals having a crimp section accommodated in each connector block, the crimp section being crimped to a contact section of an opponent terminal and also crimped to an electric wire; and electric wires arranged in predetermined paths.

In this circuit body, the inner circuit is composed of electric wires arranged in predetermined paths, and the electric wires are connected to terminals.

BRIEF DESCRIPTION OF THE DRAWINGS

FIG. 1(*a*) is a perspective view showing an overall arrangement, and FIG. 1(*b*) is a plan view in which a portion of the circuit body is shown being enlarged;

FIG. 3(*a*) is a cross-sectional view showing a condition in which the conventional circuit body is screwed to the unit body, and FIG. 3(*b*) is a cross-sectional view showing a condition in which the electric parts are directly connected to the conventional circuit body;

FIG. 5(*a*) is a cross-sectional view showing a condition in which the conventional circuit body is screwed, and FIG. 5(*b*) is a cross-sectional view showing a condition in which the electric parts are fixed to the connector block.

DETAILED DESCRIPTION OF THE PREFERRED EMBODIMENTS

Figure 1A:
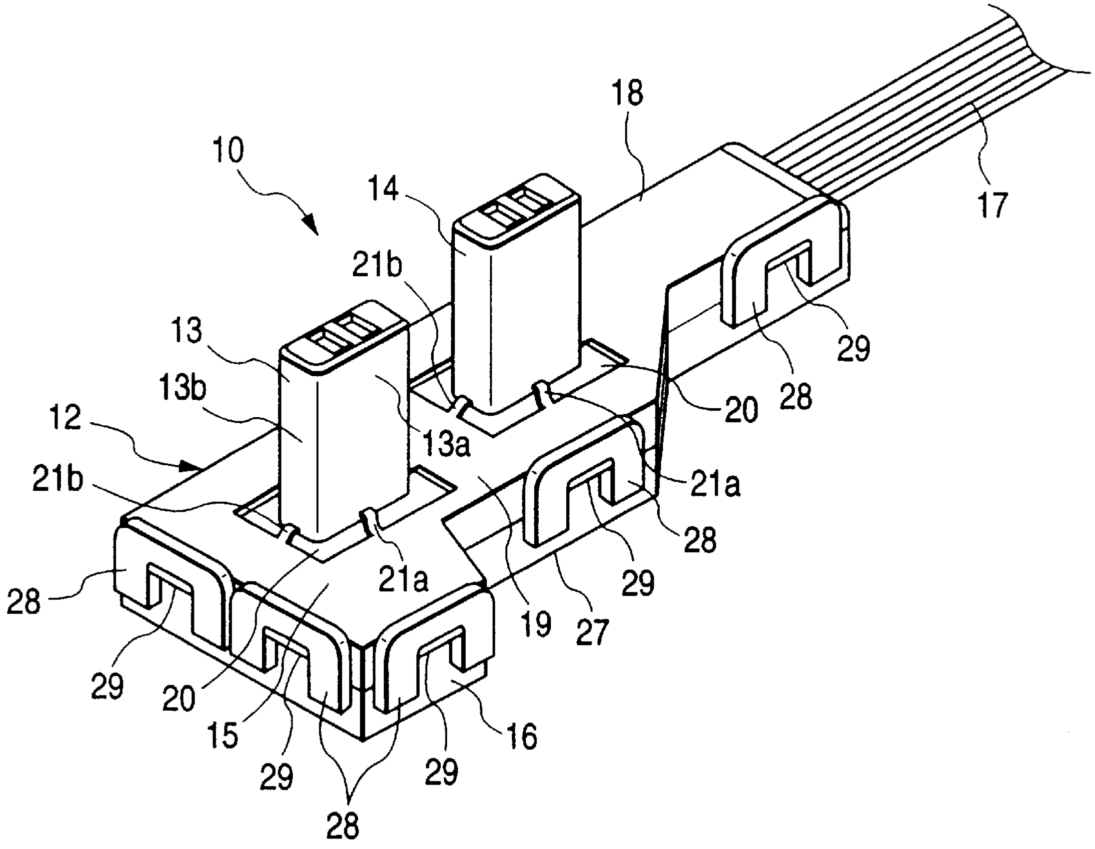
FIG. 1(*a*) and FIG. 1(*b*) are views showing a circuit body of the present invention.
Figure 1B:
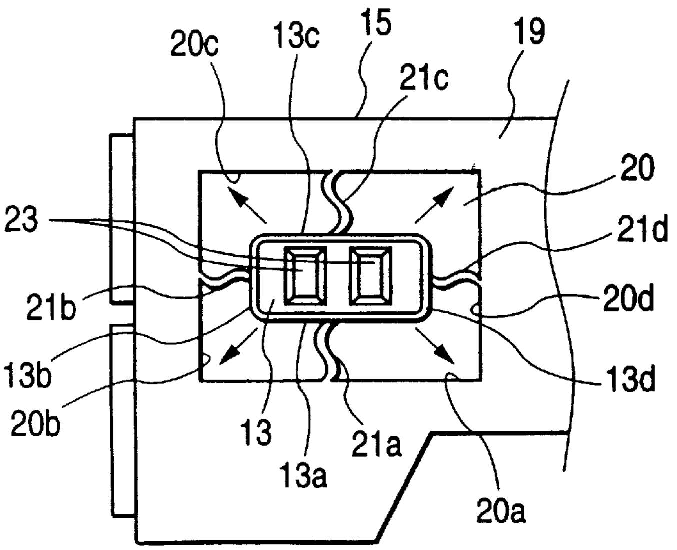
Figure 2:
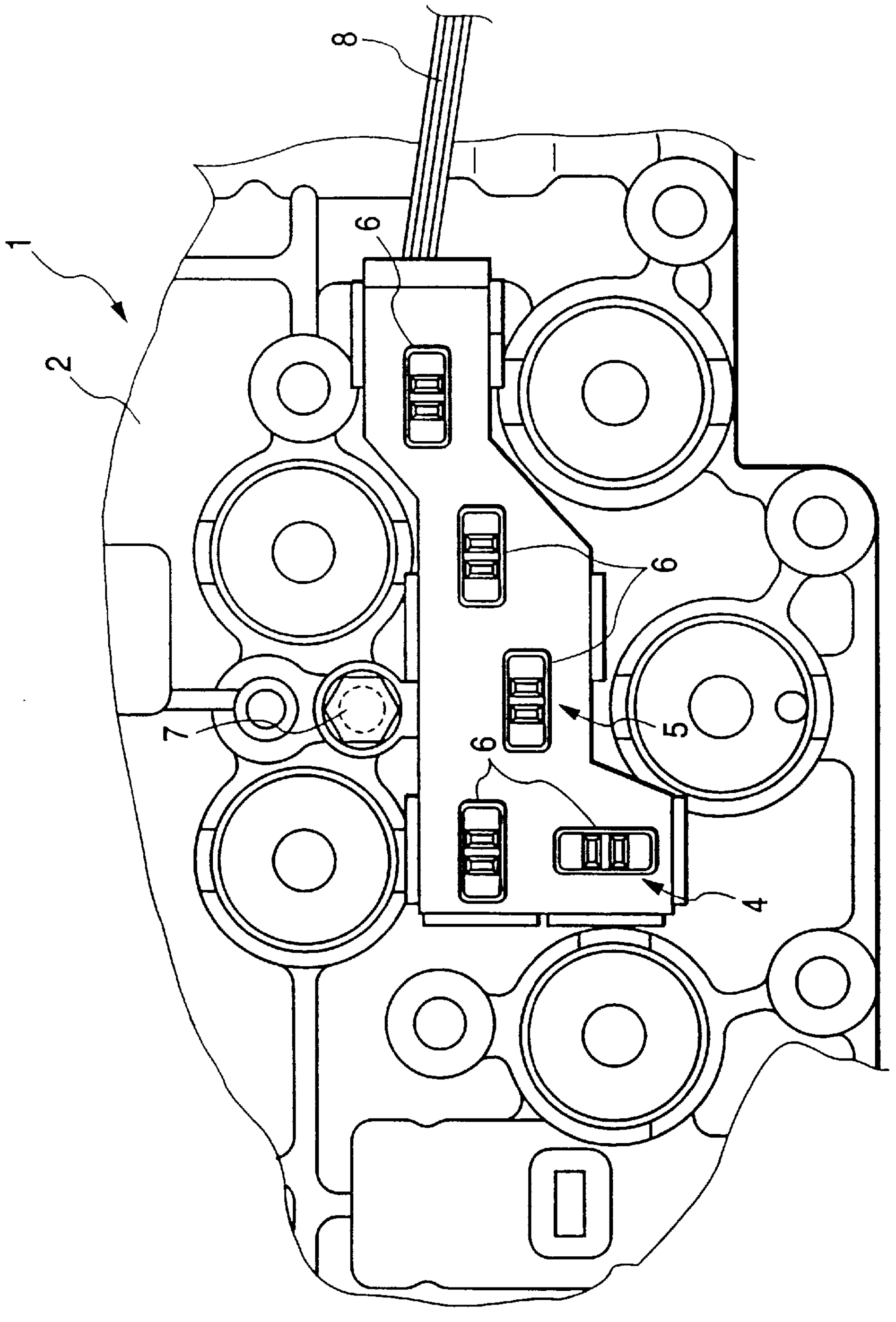
FIG. 2 PRIOR ART
FIG. 2 is a plan view showing a portion of A/T unit.

An embodiment of the circuit body of the present invention will be explained below. FIG. 1(*a*) is a view showing a circuit body 10, and FIG. 1(*b*) is a plan view showing the circuit body 10, wherein a portion of the circuit body 10 is shown being enlarged in the view.

Figure 4:
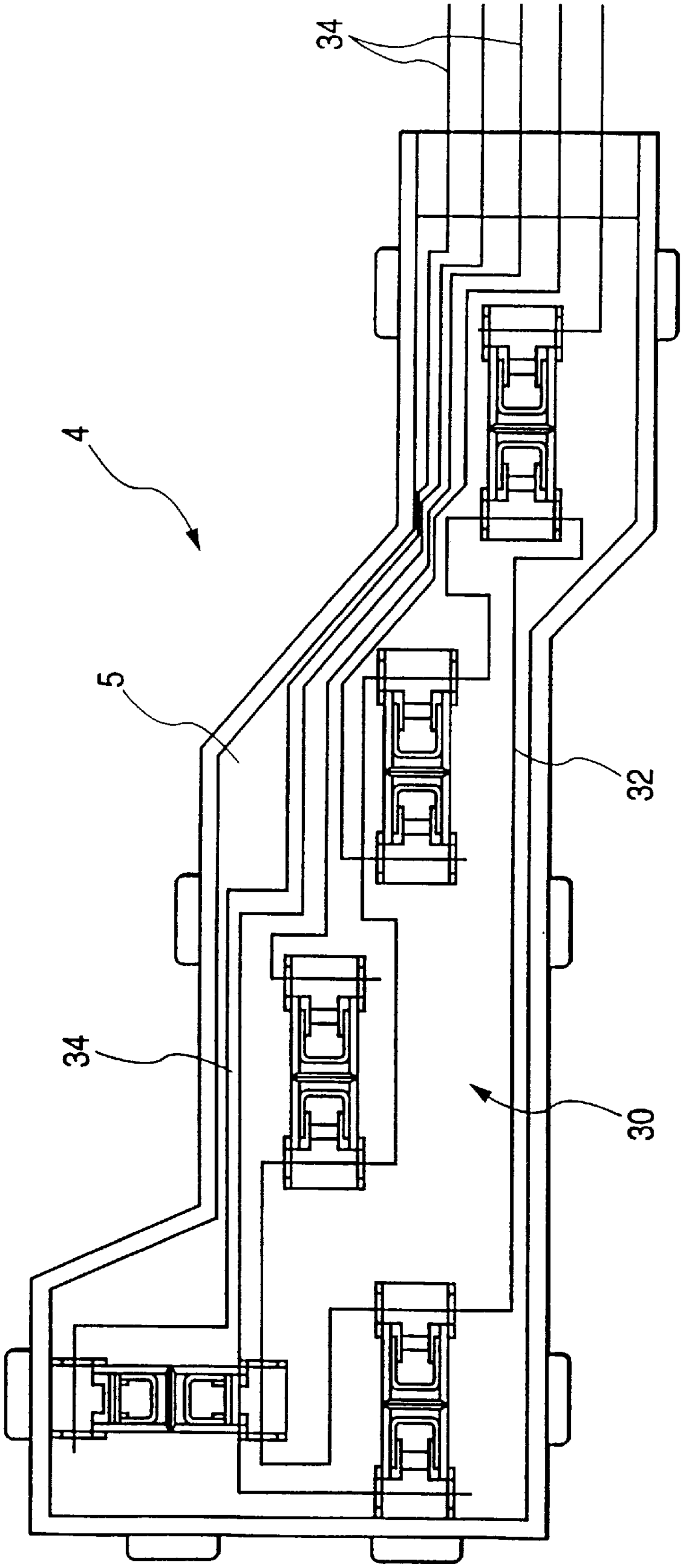
FIG. 4 PRIOR ART
FIG. 4 is a rear view showing an inner circuit on the backside of the conventional circuit body.
Figure 5B:
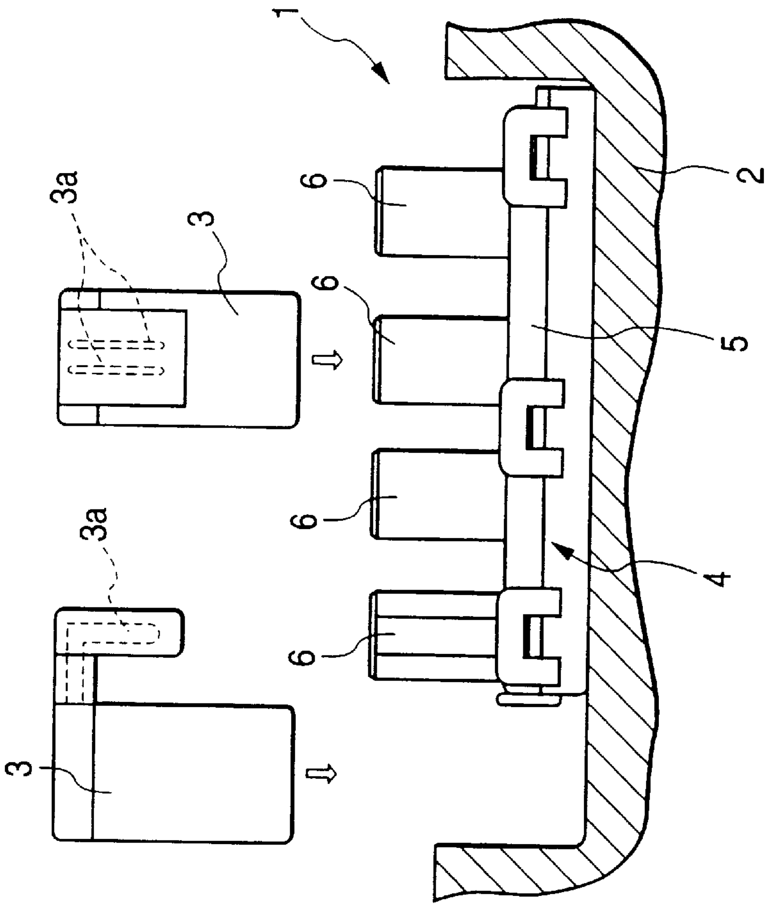
FIG. 5(*a*) and FIG. 5(*b*) are views showing a condition in which the conventional circuit body is fixed to A/T unit.
Figure 5A:
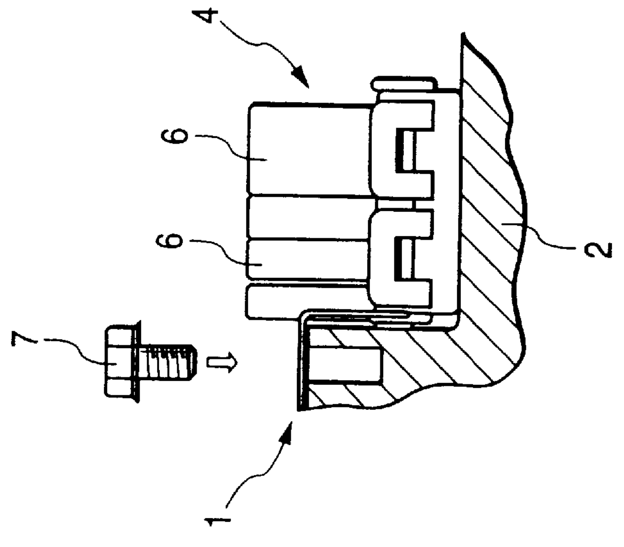

As shown in FIG. 1(*a*), the circuit body 10 includes: a primary housing 12 of the circuit body, the essential structure of which is the same as that of the circuit body 30 shown in FIG. 4, and only the wiring path of the inner circuit of which is different from that of the circuit body 30; and two connector blocks 13, 14 integrally supported by the primary housing 12 of this circuit body, directly connected to the electric parts shown in FIG. 5. The primary housing 12 of the circuit body includes: a secondary housing 15 in which the two connector blocks 13, 14 are integrally formed; and a cover 16 for closing the lower side of the secondary housing 15.

The secondary housing 15 includes: a drawing section 18 integrally made of synthetic resin, from which the wire harness 17 connected to the inner circuit is drawn out; and a connecting section 19, the width of which is larger than that of the drawing section 18. The connector blocks 13, 14 are independently supported by the connecting section 19 so that the connector blocks 13, 14 can be freely moved in a direction parallel (i.e., lateral direction) to a plane corresponding to the surface of the connecting section 19, that is, the connector blocks 13, 14 can be freely moved in a direction perpendicular to the connecting direction of the electric parts.

As shown in FIG. 1(*b*), in the connecting section 19, there are formed rectangular through-holes 20, 20 which are larger by a size than the connector blocks 13, 14. Four flexible legs 21*a*, 21*b*, 21*c*, 21*d* are respectively protruded from centers of the four inner walls 20*a*, 20*b*, 20*c*, 20*d* of these through-holes 20. The four flexible legs 21*a*, 21*b*, 21*c*, 21*d* are integrally connected to the lower portions of the four outer circumferential surfaces 13*a*, 13*b*, 13*c*, 13*d* of the connector block 13 arranged at the substantial center of the through-hole 20. Due to the above arrangement, the connector block 13 can be freely moved in any direction (lateral directions indicated by arrows in FIG. 1(*b*)) parallel to the plane corresponding to the surface of the connecting section 19. In the same manner, the connector block 14 is movably supported by the flexible legs 21*a*, 21*b*, 21*c*, 21*d* with respect to the connecting section 19.

Figure 3A:
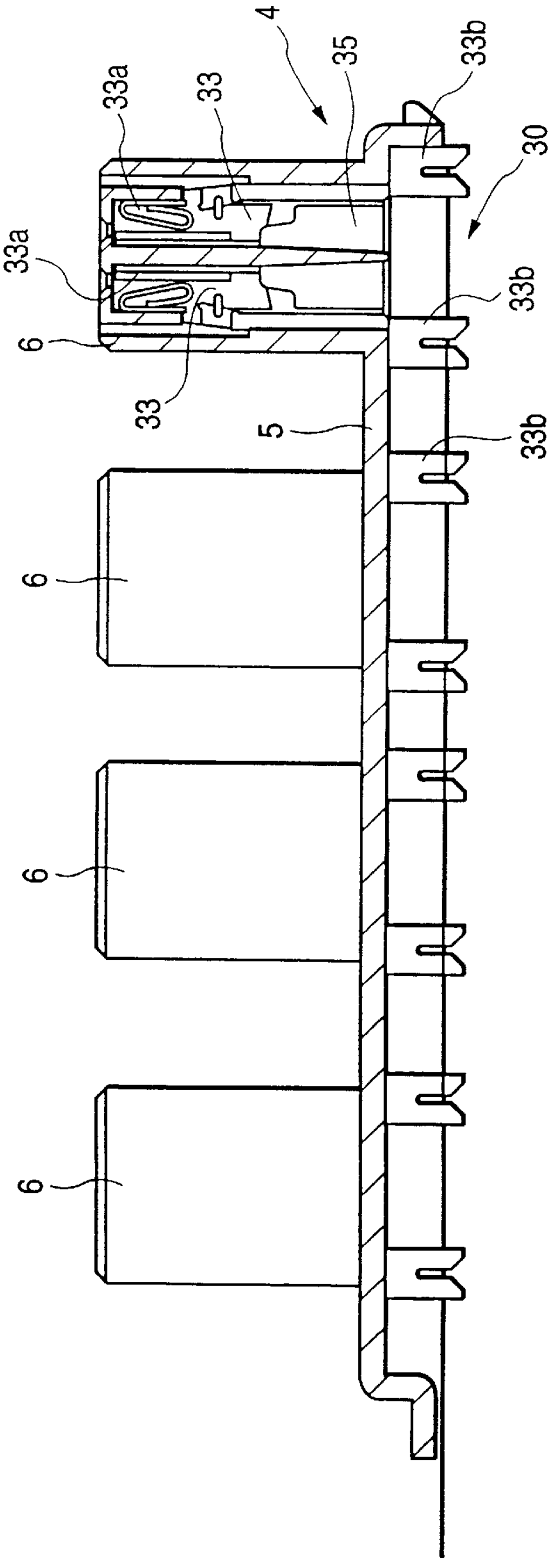
FIG. 3(a) PRIOR ART
FIG. 3(*a*) and FIG. 3(*b*) are views showing a connecting condition of the conventional circuit body with the electric parts incorporated into A/T unit.
Figure 3B:
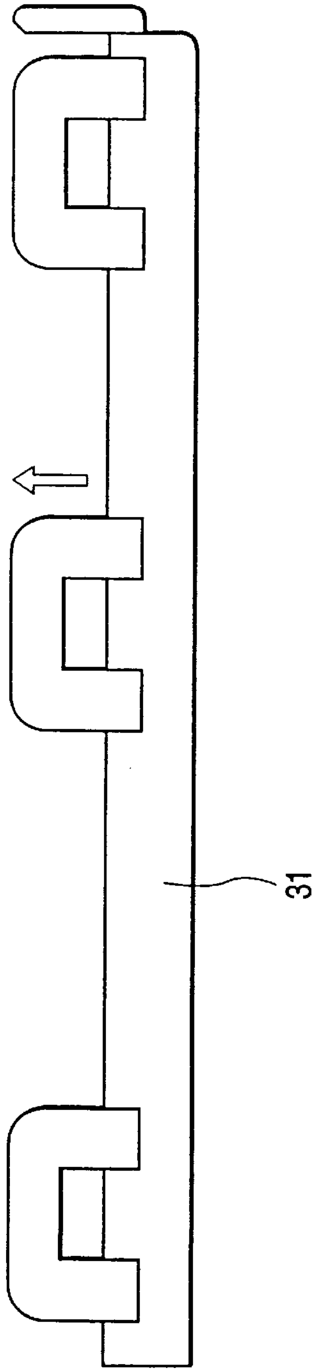
FIG. 3(b) PRIOR ART

Each connector block 13, 14 is otherwise similar to the connector blocks discussed above with reference to FIG. 3(*a*). Specifically, inside of each connector block 13, 14, there are formed two terminal accommodating chambers 35, 35. In each of these terminal accommodating chambers 35, 35, there is provided a contact section 33*a* of the terminal 33 as discussed above and shown in FIG. 3 as well as a crimp section 33*b*.

The cover 16 is composed of a closing section 27 for closing the lower side of the secondary housing 15, and a plurality of engaging frames 28. The engaging frames 28 engage with a plurality of engaging protrusions 29 protruding from the side end section of the secondary housing 15. In this way, the cover 16 is held by the secondary housing 15 via the engaging frames 28.

In this embodiment, even if the electric parts 3 deviate from predetermined positions when they are directly connected to the connector blocks 13, 14, since the connector blocks 13, 14 can be freely and independently moved in any direction with respect to the connecting direction, positional deviation of the electric parts can be absorbed.

It is possible to absorb the positional deviation of the electric parts as described above. Therefore, the reliability of connection can be enhanced.

Since the plurality of connector blocks 13, 14 can be simultaneously connected to the electric parts, it is possible to prevent the connector from being disconnected.

Since positional deviation of the electric parts can be absorbed, it is advantageous when the assembling work is automatized.

Compared with an assembling work in which the electric parts are directly connected to the connector block while the positions of the electric parts are being adjusted, this embodiment is advantageous because positional deviation of the electric parts can be absorbed. Therefore, the attaching and detaching work can be made easy and the maintenance can be easily carried out.

In the circuit body of this embodiment, the connector block 13, 14 can be respectively and independently moved. Therefore, even if positions of the electric parts connected to the connector blocks 13, 14 deviate differently from each other, the positional deviation of these electric parts can be respectively absorbed.

As explained above, according to the present invention, the connector blocks can be freely moved in a direction perpendicular to the connecting direction. Accordingly, it is possible to absorb positional deviation of the electric parts. As a result, the connector block and the electric parts can be connected in a good condition.

According to the present invention, the inner circuit is composed of electric wires arranged in predetermined paths, and the electric wires are connected by the terminals. Therefore, wiring can be easily conducted, and the manufacturing cost can be reduced.

What is claimed is:

1. A circuit body comprising:

a main circuit body having an inner circuit;

a plurality of connector blocks integrally supported by the main circuit body and directly connected to electric parts; and flexible legs for supporting the plurality of connector blocks independently from the main circuit body so that said connector blocks are freely moved in the direction perpendicular to the connecting direction of the electric parts.

2. The circuit body according to claim 1, wherein the inner circuit includes:

a plurality of terminals having a crimp section accommodated in each connector block, the crimp section being crimped to a contact section of an opponent terminal and crimped to a wire; and electric wires arranged in predetermined paths.

* * * * *